United States Patent [19]

Taylor

[11] Patent Number: 5,703,543
[45] Date of Patent: Dec. 30, 1997

[54] CURRENT LIMITED CROSS-COUPLED OSCILLATORS

[76] Inventor: Clive Roland Taylor, 1 Cherry Croft, Welwyn Garden City, Hertfordshire, England, AL8 7QU

[21] Appl. No.: 643,759

[22] Filed: May 6, 1996

[51] Int. Cl.[6] .................................................. H03B 5/36
[52] U.S. Cl. .................................. 331/116 FE; 331/158; 331/175; 331/116 R; 331/117 R
[58] Field of Search ........................ 331/108 R, 113 R, 331/116 R, 116 FE, 117 R, 117 FE, 158, 175

[56] References Cited

U.S. PATENT DOCUMENTS 4,947,140   8/1990   Tateishi ............................ 331/113 R

*Primary Examiner*—David Mis
*Attorney, Agent, or Firm*—Burns, Doane, Swecker & Mathis LLP

[57] ABSTRACT

A switching oscillator constituted by two inverters is provided with a system of current mirrors each arranged to provide a small proportion of load current from the load of one transistor to the load circuit of the other such as to drive the load currents into equilibrium.

4 Claims, 1 Drawing Sheet

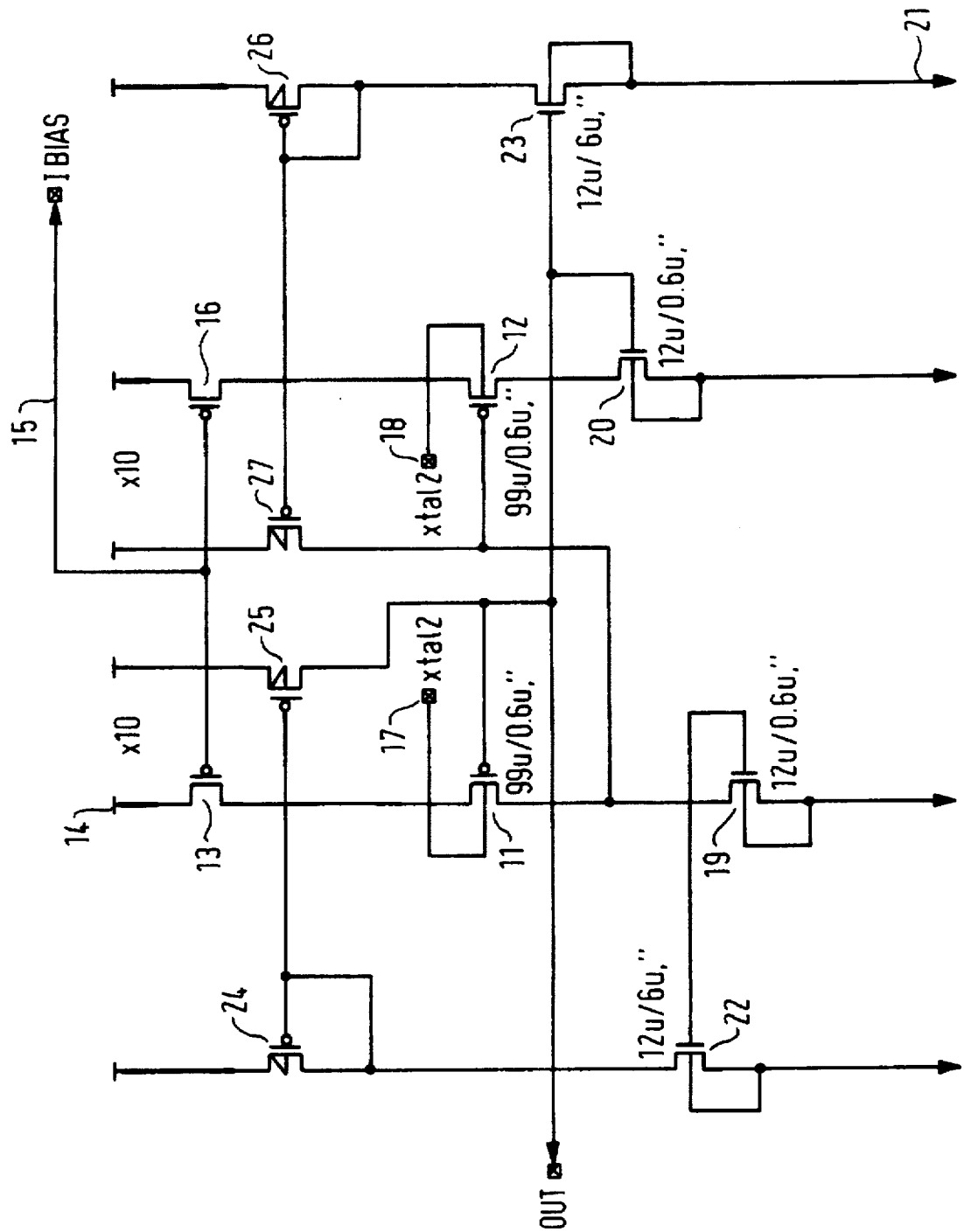

CURRENT LIMITED CROSS-COUPLED OSCILLATORS

This invention relates to cross-coupled switching oscillators.

BACKGROUND TO THE INVENTION

It is known to constitute an oscillator by means of a pair of cross-coupled switching transistors. In one form of a typical circuit, a first p-channel transistor has its drain connected to the gate of a second p-channel transistor whereas the second p-channel transistor has its drain connected to the gate of the first p-channel transistor. The sources of the transistors are connected by a frequency selective circuit branch, typically constituted by a quartz crystal. Each of the transistors may be in series with an appropriate sourcing transistor and a respective load transistor.

Such a circuit is essentially a pair of cross-coupled inverters.

It is known to provide a resistor between the drain outputs of the two transistors of the cross-coupled oscillator in order to set the equilibrium operating point of the oscillator. However, providing an accurate high value resistor is not convenient in many integrated circuit structures. For example, the resistor could be implemented in the form of a diffused structure. The resistance thereof can vary significantly in response to temperature and process variations. Poorly controlled resistor values lead to instability in the oscillator and parasitic RC elements introduce undesired frequency shift.

SUMMARY OF THE INVENTION

The present invention has the object of providing improved negative feedback between the switching elements of a cross-coupled inverter oscillator. A further object of the invention is to facilitate rapid starting of the oscillator. A further object of the invention is to enable an oscillator of the aforementioned kind to operate within very wide ranges of supply voltages and operating temperature while maintaining great stability in the output frequency.

The invention is based on a system of current mirrors which provide a small proportion of negative feedback of current from the load of one inverter to the other inverter's load. In a preferred form of the invention each load is constituted by a transistor which forms part of a respective current mirror.

BRIEF DESCRIPTION OF THE DRAWING

The single Figure illustrates byway of example one circuit which embodies the invention.

DESCRIPTION OF THE EXEMPLARY EMBODIMENT

The circuit shown in the drawing is that of a cross-coupled inverter oscillator which typically provides an output of the order of 70 Mhz or greater.

The basic switching elements of the circuit are a first p-channel transistor 11 and a second p-channel transistor 12. The transistor 11 is provided with a source current by means of a p-channel transistor 13 of which the source is connected to the positive supply rail 14, the drain is connected to the source node of the p-channel transistor 11 and the gate is connected to a common bias input terminal 15. Likewise, the second switching transistor 12 is provided with a source current by a p-channel transistor 16 of which the source is connected to the positive supply rail, the gate is connected to the input bias current terminal 15 and the drain is connected to the source node of the p-channel transistor 12.

The drain of the first transistor 11 is connected to the gate of the second transistor 12 and the drain of the transistor 12 is connected to the gate of the transistor 11 so that transistors 11 and 12 are connected as a cross-coupled pair. Further, the sources of the transistors 11 and 12 are connected to terminals 17 and 18 between which would normally be disposed a frequency selective circuit branch or element, such as a quartz crystal.

Normally, each of the transistors 11 and 12 would be provided with an active load constituted by a transistor, typically an n-channel transistor of which (as are the transistors 19 and 20) the drains are connected to the drains of the respective p-channel transistors 11 and 12 and the sources are connected to ground 21 or relatively negative supply rail.

The object of the present invention is to provide an improved system whereby a stable percentage value of current from the load of one inverter element is coupled to the other inverter's load element, independently of process variations, voltage supply variations and temperature. The purpose is to facilitate rapid starting of the oscillator by forcing the voltage bias at the input to its correct value and to enable the oscillator to operate within very wide operating conditions while maintaining a high stability of oscillation.

The load of the first switching transistor 11 is constituted as a first current mirror constituted by the transistors 19 and 22. Transistor 22 is an n-channel transistor of which the drain is connected to the drain of transistor 11 and the source is connected to the negative supply rail or ground. The gate of the transistor 19 is connected to the drain and is also connected to the gate of the transistor 22 of which the source is connected to the relatively negative supply rail and the drain is connected to an upper current mirror to be described. The transistors 19 and 22 are selected such that transistor 19 has (in this example) ten times the current as transistor 22.

A similar current mirror is constituted by the transistors 20 and 23. Likewise, the drain of p-channel transistor 12 is connected to the transistor 22 of which the gate is connected to the drain and is also connected to the gate of the transistor 23 of which the source is connected to the negative rail and the drain is connected to an upper current mirror to be described. The size relationship between transistors 22 and 20 is preferably the same as that between transistors 23 and 19.

The current mirrored by way of transistors 19 and 22 is mirrored again by way of p-channel transistors 24 and 25. Specifically, the drain of the mirror transistor 22 is connected to the drain of the p-channel transistor 24 of which the source is connected to the positive rail and the gate is connected to the gate of another p-channel transistor 25 of which the source is connected to the positive rail and the drain is connected to the gate of the first switching transistor 11 and the drain of the second switching transistor 12. The gate and drain of transistor 24 are connected, so that transistors 24 and 25 form a current mirror. The transistors 24 and 25 are relatively sized such that transistor 25 passes half the current as does the transistor 24, whereby the collector current of transistor 25 is one-twentieth of the current through transistor 19. Likewise, the drain of the transistor 23 is connected to the drain of a p-channel transistor 26 of which the gate is connected to the gate of another p-channel transistor 27 of which the source is connected to the positive supply rail and the drain is connected to the gate of the second switching transistor 12 and the drain of the first switching transistor 10. The gate and drain of transistor 26 are connected so that transistors 26 and 27 form a current mirror. Again, the transistor 27 passes half the current as does the transistor 26 so that the feedback current through the collector of transistor 27 is one-twentieth (5%) of the current through transistor 20.

At equilibrium the current $i_1$ through transistor 11 and its source transistor 13 should be equal to $i_2$, the current through transistor 12 and its source transistor 16, the voltage levels at terminals 17 and 18 should be equal and the voltages $vg_1$ and $vg_2$ at the gates of the load transistors 19 and 20 should be equal. The current through load transistor 19 is $(i_1+i_2/20)$ and that through transistor 20 is $(i_2+i_1/20)$, the total current being set in this example as $i_1+i_2+3i_1/20+3i_2/20$. Any discrepancy between $i_1$ and $i_2$ would be eliminated rapidly by the feedback provided byway of the current mirrors.

Different technical implementations of the circuit are feasible. Lateral pnp transistors may, for example, be used in a Bi-MOS process as the source transistors and the upper current mirrors. In a standard process they are not preferred because they exhibit inconsistent, low beta values and would require additional transistors for the setting of their base currents. Also, in a standard CMOS process, the vertical parasitic components of currents of lateral pnp transistors could introduce unacceptable levels of leakage.

I claim:

1. An oscillator circuit comprising:

a first switching transistor and a second switching transistor, each having a control node and a load current node, the control node of the first transistor being connected to the load current node of the second switching transistor and the control node of the second transistor being connected to the load current node of the first switching transistor;

a first current mirror for the load current of the first transistor;

a second current mirror for the load current of the second transistor;

a third current mirror connected to said first current mirror and which mirrors a small proportion of the load current of the first switching transistor to the load current node of the second switching transistor; and a fourth current mirror connected to the second current mirror and which mirrors a small proportion of the load current of the second switching transistor to the load current node of the first switching transistor;

whereby said current mirrors drive load currents of the switching transistors into equilibrium.

2. An oscillator circuit according to claim 1 and further comprising first and second source transistors for providing source current to said first and second transistors respectively, and means for providing a common bias for said first and second source transistors.

3. An oscillator circuit according to claim 1 wherein said first and second current mirrors each comprise a load transistor for the load current of the first and second switching transistors respectively.

4. An oscillator circuit comprising:

first and second switching transistors which are mutually cross-coupled to constitute a switching loop;

first and second active load elements for said first and second switching transistors respectively;

a first current mirror including said first active load element;

a second current mirror including said second active load element;

means for providing current feedback from said first current mirror to the second load element and from said second current mirror to said first load element to maintain load currents through said switching transistors in equilibrium.

* * * * *